United States Patent
Zhang et al.

(10) Patent No.: US 11,359,281 B2
(45) Date of Patent: Jun. 14, 2022

(54) SELECTIVE DEPOSITION OF SICON BY PLASMA ALD

(71) Applicant: Applied Materials, Inc., Santa Clara, CA (US)

(72) Inventors: Shuaidi Zhang, Santa Clara, CA (US); Ning Li, San Jose, CA (US); Mihaela Balseanu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 25 days.

(21) Appl. No.: 16/752,678

(22) Filed: Jan. 26, 2020

(65) Prior Publication Data

US 2021/0230747 A1   Jul. 29, 2021

(51) Int. Cl.
| | |
|---|---|
| C23C 16/40 | (2006.01) |
| C23C 16/455 | (2006.01) |
| C23C 16/458 | (2006.01) |
| C23C 16/06 | (2006.01) |
| C23C 16/02 | (2006.01) |

(52) U.S. Cl.
CPC ...... C23C 16/4554 (2013.01); C23C 16/0227 (2013.01); C23C 16/06 (2013.01); C23C 16/4583 (2013.01)

(58) Field of Classification Search
None
See application file for complete search history.

(56) References Cited

U.S. PATENT DOCUMENTS

| | | | |
|---|---|---|---|
| 2002/0045355 A1* | 4/2002 | Chong | H01L 21/28518 438/721 |
| 2015/0004804 A1 | 1/2015 | Orihashi et al. | |
| 2016/0322214 A1* | 11/2016 | Li | H01L 21/0228 |
| 2017/0323775 A1* | 11/2017 | Saly | H01L 21/02211 |
| 2018/0061629 A1 | 3/2018 | Saly et al. | |
| 2018/0211833 A1* | 7/2018 | Li | H01L 21/3105 |
| 2019/0034827 A1 | 11/2019 | Yan et al. | |
| 2020/0010954 A1 | 1/2020 | Bhuyan et al. | |

FOREIGN PATENT DOCUMENTS

| | | |
|---|---|---|
| KR | 20170055924 A | 5/2017 |
| KR | 20180100772 A | 9/2018 |

OTHER PUBLICATIONS

PCT International Search Report and Written Opinion in PCT/US2021/014891 dated May 12, 2021, 8 pages.

* cited by examiner

*Primary Examiner* — David P Turocy
(74) *Attorney, Agent, or Firm* — Servilla Whitney LLC

(57) ABSTRACT

Methods of selectively forming SiCON films are described. In some embodiments, the methods comprise sequential exposure to a silicon halide, a mixture of alkanolamine and amine reactants and a deposition plasma. In some embodiments, the method further comprises pre-cleaning the target substrate to improve selectivity.

18 Claims, 6 Drawing Sheets

SELECTIVE DEPOSITION OF SICON BY PLASMA ALD

TECHNICAL FIELD

Embodiments of the present disclosure generally relate to methods for the selective deposition of silicon oxycarbonitride (SiCON).

BACKGROUND

The semiconductor industry faces many challenges in the pursuit of device miniaturization which involves rapid scaling of nanoscale features. Such issues include the introduction of complex fabrication steps such as multiple lithography steps and integration of high performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (e.g., metallic over dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor.

During selective deposition processes material is deposited on a first material surface while a second material surface is left unaffected. Yet, some materials are typically deposited using plasma based deposition schemes. For example, silicon carbooxynitrides (SiCON) may be deposited by plasma-enhanced atomic layer deposition (PEALD). Selective deposition in these plasma-based processes may be difficult because a plasma reactant may modify the exposed surface which is not being deposited onto.

Therefore, there is an ongoing need in the art for methods to selectively deposit films by plasma based processes. More specifically, there is a need for methods which selectively deposit SiCON films by PEALD.

SUMMARY

One or more embodiments of the disclosure are directed to a method of selectively depositing a SiCON layer. The method comprises exposing a substrate having a surface comprising a first material surface and a second material surface to a first reactive gas comprising a halosilane. The first reactive gas is purged from the substrate surface. The substrate surface is exposed to a second reactive gas comprising an alkanolamine and an amine. The second reactive gas is purged from the substrate surface. The substrate surface is exposed to a deposition plasma comprising $H_2$. A first thickness of SiCON deposited on the first material surface is greater than a second thickness of SiCON deposited on the second material surface.

Additional embodiments of the disclosure are directed to a method of selectively depositing a SiCON layer. The method comprising sequentially exposing a substrate surface comprising a first material and a second material to a first reactive gas, a second reactive gas and a deposition plasma. The second material comprises silicon oxide. The first reactive gas comprises a halosilane. The second reactive gas comprises ethylenediamine and ethanolamine. The deposition plasma comprises $H_2$. The sequential exposures are repeated to form a SiCON layer with a predetermined first thickness on the first material and a second thickness on the second material. The predetermined first thickness being greater than the second thickness.

Further embodiments of the disclosure are directed to a method of selectively depositing a SiCON layer. The method comprises exposing a substrate having a surface comprising a first material surface and a second material surface to a first process condition in a first process region. The first process condition comprises a halosilane. The substrate is laterally moved through a gas curtain from the first process region to a second process region. The gas curtain comprises a purge gas stream and optionally a vacuum region. The substrate surface is exposed to a second process condition in the second process region. The second process condition comprises an alkanolamine and an amine. The substrate is laterally moved through a gas curtain from the second process region to a third process region. The gas curtain comprises a purge gas stream and optionally a vacuum region. The substrate surface is exposed to a third process condition in the third process region. The third process condition comprises a deposition plasma comprising $H_2$. The substrate is laterally moved through a gas curtain from the third process region. The gas curtain comprises a purge gas stream and optionally a vacuum region. Exposures to the first process condition, the second process condition and the third process condition are repeated to selectively deposit a SiCON film with a predetermined first thickness on the first surface and a second thickness on the second surface. The predetermined first thickness is greater than the second thickness.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
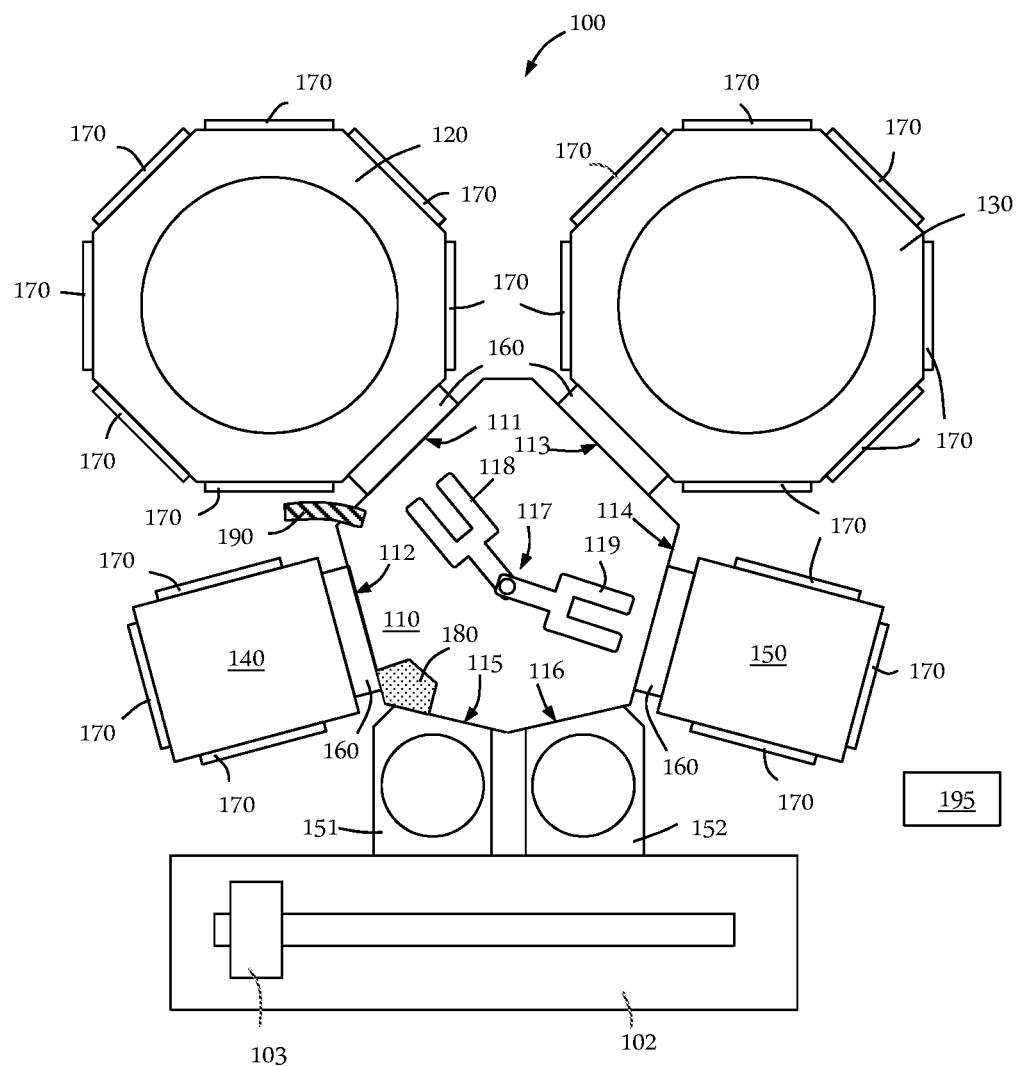
FIG. 1 illustrates a schematic view of a processing platform in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction).

One or more embodiments of the disclosure are directed to processes that use a reaction chamber with multiple gas ports that can be used for introduction of different chemicals or plasma gases. Spatially, these gas ports (also referred to as channels) are separated by inert purging gases and/or vacuum pumping holes to create a gas curtain that minimizes or eliminates mixing of gases from different gas ports to avoid unwanted gas phase reactions. Wafers moving through these different spatially separated ports get sequential and multiple surface exposures to different chemical or plasma environment so that layer by layer film growth in spatial ALD mode or surface etching process occur. In one or more embodiments, the processing chamber has modular architectures on gas distribution components and each modular component has independent parameter control (e.g., RF or gas flow) to provide flexibility to control, for example, gas flow and/or RF exposure.

Embodiments of the present disclosure relate to methods for selectively depositing a SiCON layer on a first material surface over a second material surface. In some embodiments, the first material surface comprises a metal, an amine terminated surface or silicon. In some embodiments, the second material surface comprises silicon oxide.

As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface.

The term "over" used in this regard does not imply a physical orientation of one surface on top of another surface, rather a relationship of the thermodynamic or kinetic properties of the chemical reaction with one surface relative to the other surface. For example, selectively depositing a film onto a metal surface over a dielectric surface means that the film deposits on the metal surface and less or no film deposits on the dielectric surface; or that the formation of the film on the metal surface is thermodynamically or kinetically favorable relative to the formation of the film on the dielectric surface.

The selectivity of a deposition process may be expressed as a multiple of growth rate. For example, if one surface is grown (or deposited on) 25 times faster than a different surface, the process would be described as having a selectivity of 25:1. In this regard, higher ratios indicate more selective processes. The selectivity of a deposition process may also be expressed by stating the amount of film which can be deposited on a first surface before the film deposits on a second surface.

One or more embodiments of the disclosure advantageously provide methods for selectively depositing a SiCON film. In some embodiments, the first material surface comprises silicon and the second material surface comprises silicon oxide. In these embodiments, the methods disclosed herein provide for the deposition of about 30 Å to about 50 Å of SiCON film on the first material surface without substantial deposition on the second material surface. As used in this regard, "substantial deposition" refers to a layer of material with a measurable thickness deposited on the second material surface.

One or more embodiments of the disclosure utilize a spatial ALD process which is performed on a processing platform as disclosed herein. Referring to the Figures, FIG. 1 shows a processing platform 100 in accordance with one or more embodiments of the disclosure. The embodiment shown in FIG. 1 is merely representative of one possible configuration and should not be taken as limiting the scope of the disclosure. For example, in one or more embodiments, the processing platform 100 has different numbers of process chambers, buffer chambers, and robot configurations.

The processing platform 100 includes a central transfer station 110 which has a plurality of sides 111, 112, 113, 114, 115, 116. The central transfer station 110 shown has a first side 111, a second side 112, a third side 113, a fourth side 114, a fifth side 115 and a sixth side 116. Although six sides are shown, those skilled in the art will understand that there can be any suitable number of sides to the central transfer station 110 depending on, for example, the overall configuration of the processing platform 100.

The transfer station 110 has a robot 117 positioned therein. The robot 117 can be any suitable robot capable of moving a wafer during processing. In one or more embodiments, the robot 117 has a first arm 118 and a second arm 119. The first arm 118 and second arm 119 can be moved independently of the other arm. The first arm 118 and second arm 119 can move in the x-y plane and/or along the z-axis. In one or more embodiments, the robot 117 includes a third arm or a fourth arm (not shown). Each of the arms can move independently of other arms.

A first batch processing chamber 120 can be connected to a first side 111 of the central transfer station 110. The first batch processing chamber 120 can be configured to process x wafers at a time for a batch time. In one or more embodiments, the first batch processing chamber 120 can be configured to process in the range of about four (x=4) to about 12 (x=12) wafers at the same time. In one or more embodiments, the first batch processing chamber 120 is configured to process six (x=6) wafers at the same time. As will be understood by the skilled artisan, while the first batch processing chamber 120 can process multiple wafers between loading/unloading of an individual wafer, each wafer may be subjected to different process conditions at any given time. For example, a spatial atomic layer deposition chamber, like that shown in FIGS. 2 through 6, expose the wafers to different process conditions in different processing regions so that as a wafer is moved through each of the regions, the process is completed.

Figure 2:
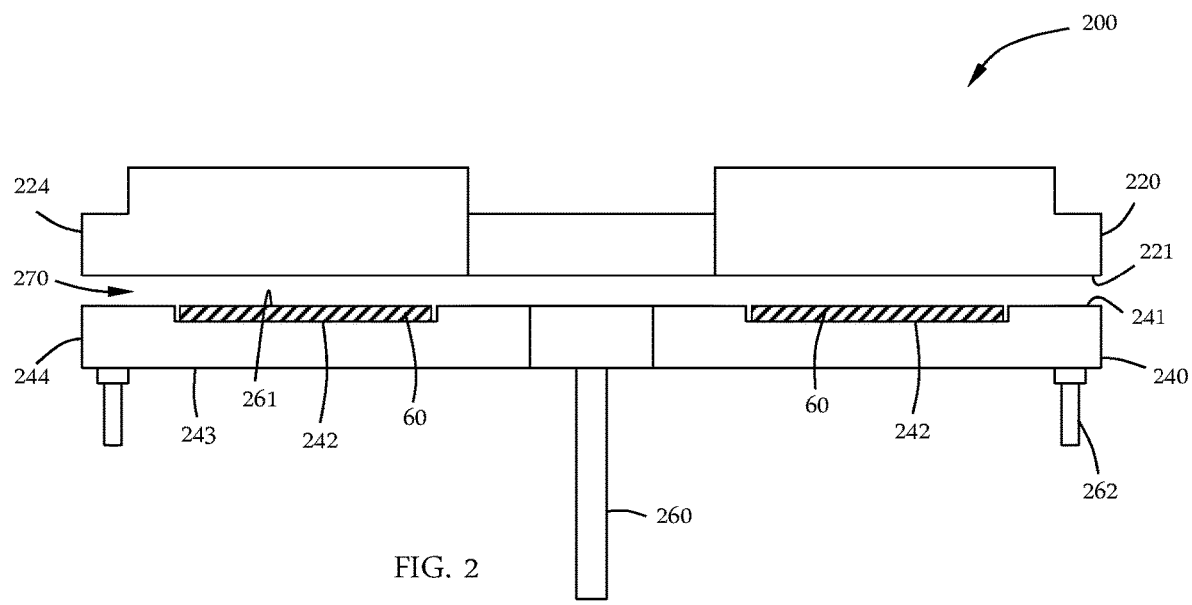
FIG. 2 illustrates a cross-sectional view of a batch processing chamber in accordance with one or more embodiments of the disclosure.

FIG. 2 shows a cross-section of a processing chamber 200 including a gas distribution assembly 220, also referred to as injectors or an injector assembly, and a susceptor assembly 240. The gas distribution assembly 220 is any type of gas delivery device used in a processing chamber. The gas distribution assembly 220 includes a front surface 221 which faces the susceptor assembly 240. The front surface 221 can have any number or variety of openings to deliver a flow of gases toward the susceptor assembly 240. The gas distribution assembly 220 also includes an outer peripheral edge 224 which in the embodiments shown, is substantially round.

The specific type of gas distribution assembly 220 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 3:
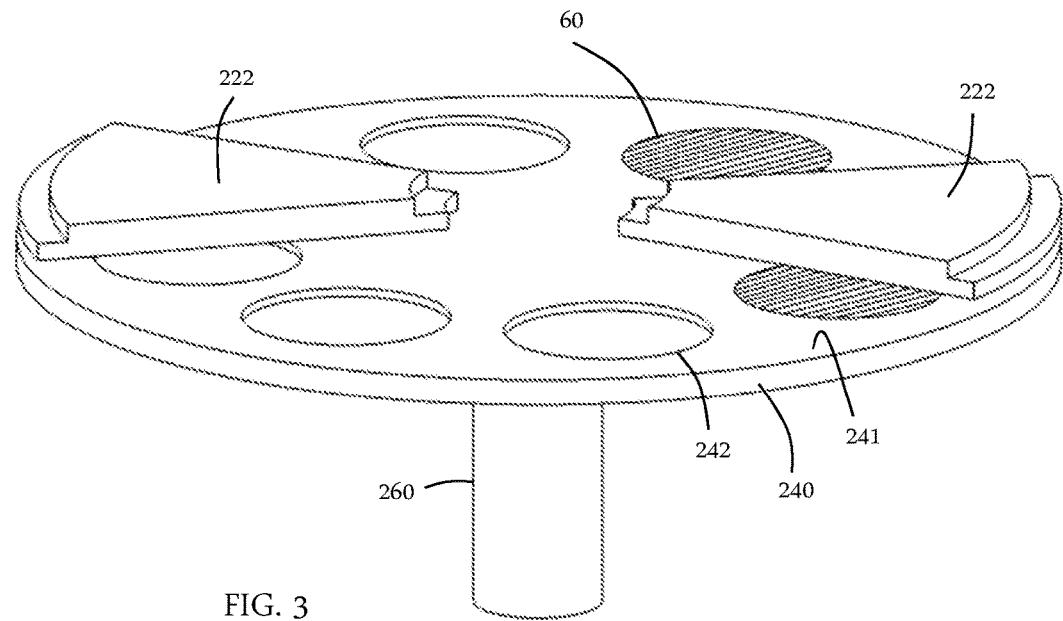
FIG. 3 illustrates a partial perspective view of a batch processing chamber in accordance with one or more embodiments of the disclosure.

In one or more embodiments, the gas distribution assembly 220 is a rigid stationary body made of a single injector unit. In one or more embodiments, the gas distribution assembly 220 is made up of a plurality of individual sectors (e.g., injector units 222), as shown in FIG. 3. Either a single piece body or a multi-sector body can be used with the various embodiments of the disclosure described.

In one or more embodiments, a susceptor assembly 240 is positioned beneath the gas distribution assembly 220. The susceptor assembly 240 includes a top surface 241 and at least one recess 242 in the top surface 241. The susceptor assembly 240 also has a bottom surface 243 and an edge 244. The at least one recess 242 can be any suitable shape and size depending on the shape and size of the substrates 60 being processed. In the embodiments shown in FIG. 2, the recess 242 has a flat bottom to support the bottom of the wafer; however, the bottom of the recess can vary. In one or more embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In one or more embodiments, as shown in FIG. 2, the recess 242 in the top surface 241 of the susceptor assembly 240 is sized so that a substrate 60 supported in the recess 242 has a top surface 61 substantially coplanar with the top surface 241 of the susceptor 240. As used in this specification and the appended claims, the term "substantially coplanar" means that the top surface of the wafer and the top surface of the susceptor assembly are coplanar within ±0.2 mm. In one or more embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 240 of FIG. 2 includes a support post 260 which is capable of lifting, lowering and rotating the susceptor assembly 240. The susceptor assembly may include a heater, or gas lines, or electrical components within the center of the support post 260. The support post 260 may be the primary means of increasing or decreasing the gap between the susceptor assembly 240 and the gas distribution assembly 220, moving the susceptor assembly 240 into proper position. The susceptor assembly 240 may also include fine tuning actuators 262 which can make micro-adjustments to susceptor assembly 240 to create a predetermined gap 270 between the susceptor assembly 240 and the gas distribution assembly 220.

In one or more embodiments, the gap 270 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 200 shown in the Figures is a carousel-type chamber in which the susceptor assembly 240 can hold a plurality of substrates 60. As shown in FIG. 3, the gas distribution assembly 220 may include a plurality of separate injector units 222, each injector unit 222 being capable of depositing a film on the wafer, as the wafer is moved beneath the injector unit. Two pie-shaped injector units 222 are shown positioned on approximately opposite sides of and above the susceptor assembly 240. This number of injector units 222 is shown for illustrative purposes only. It will be understood that more or less injector units 222 can be included. In one or more embodiments, there are a sufficient number of pie-shaped injector units 222 to form a shape conforming to the shape of the susceptor assembly 240. In one or more embodiments, each of the individual pie-shaped injector units 222 may be independently moved, removed and/or replaced without affecting any of the other injector units 222. For example, one segment may be raised to permit a robot to access the region between the susceptor assembly 240 and gas distribution assembly 220 to load/unload substrates 60.

Figure 4:
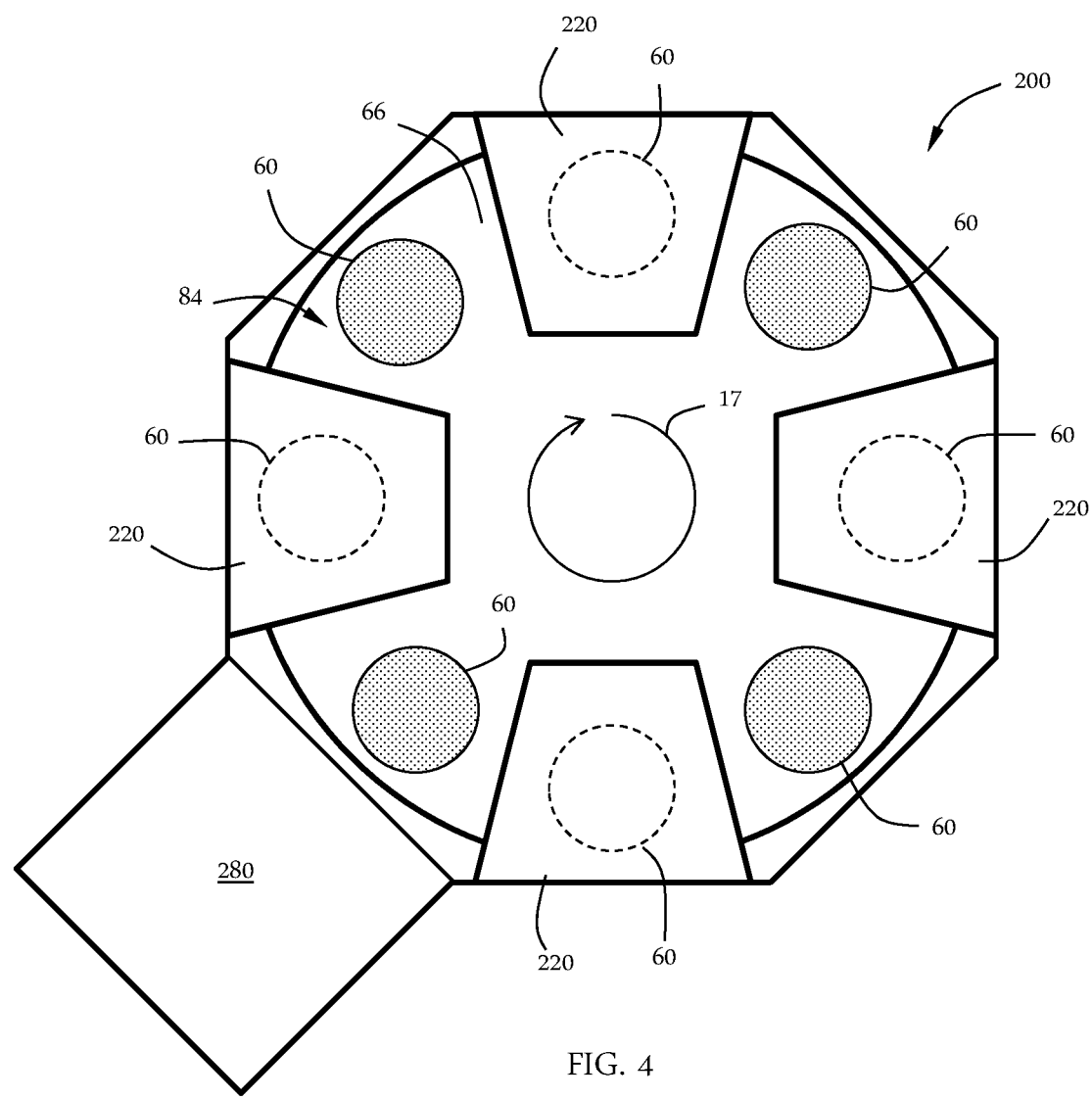
FIG. 4 illustrates a schematic view of a batch processing chamber in accordance with one or more embodiments of the disclosure.

In one or more embodiments, processing chambers having multiple gas injectors can be used to process multiple wafers simultaneously so that the wafers experience the same process flow. For example, as shown in FIG. 4, the processing chamber 200 has four gas injector assemblies and four substrates 60. At the outset of processing, the substrates 60 can be positioned between the gas distribution assemblies 220. Rotating 17 the susceptor assembly 240 by 45° will result in each substrate 60 which is between gas distribution assemblies 220 to be moved to a gas distribution assembly 220 for film deposition, as illustrated by the dotted circle under the gas distribution assemblies 220. An additional 45° rotation would move the substrates 60 away from the gas distribution assemblies 220. The number of substrates 60 and gas distribution assemblies 220 can be the same or different. In One or more embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 220 includes eight process regions separated by gas curtains and the susceptor assembly 240 can hold six wafers.

The processing chamber 200 shown in FIG. 4 is merely representative of one possible configuration and should not be taken as limiting the scope of the disclosure. Here, the processing chamber 200 includes a plurality of gas distribution assemblies 220. In the embodiments shown, there are four gas distribution assemblies 220 (also called injector assemblies) evenly spaced about the processing chamber 200. The processing chamber 200 shown is octagonal; however, those skilled in the art will understand that this is one possible shape and should not be taken as limiting the scope of the disclosure. The gas distribution assemblies 220 shown are trapezoidal, but can be a single circular component or made up of a plurality of pie-shaped segments, like that shown in FIG. 3.

The embodiment shown in FIG. 4 includes a load lock chamber 280, or an auxiliary chamber like a buffer station. This chamber 280 is connected to a side of the processing chamber 200 to allow, for example the substrates (also referred to as substrates 60) to be loaded/unloaded from the processing chamber 200. A wafer robot may be positioned in the chamber 280 to move the substrate onto the susceptor.

Rotation of the carousel (e.g., the susceptor assembly 240) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing routines between each layer deposition (e.g., exposure to plasma).

Figure 5:
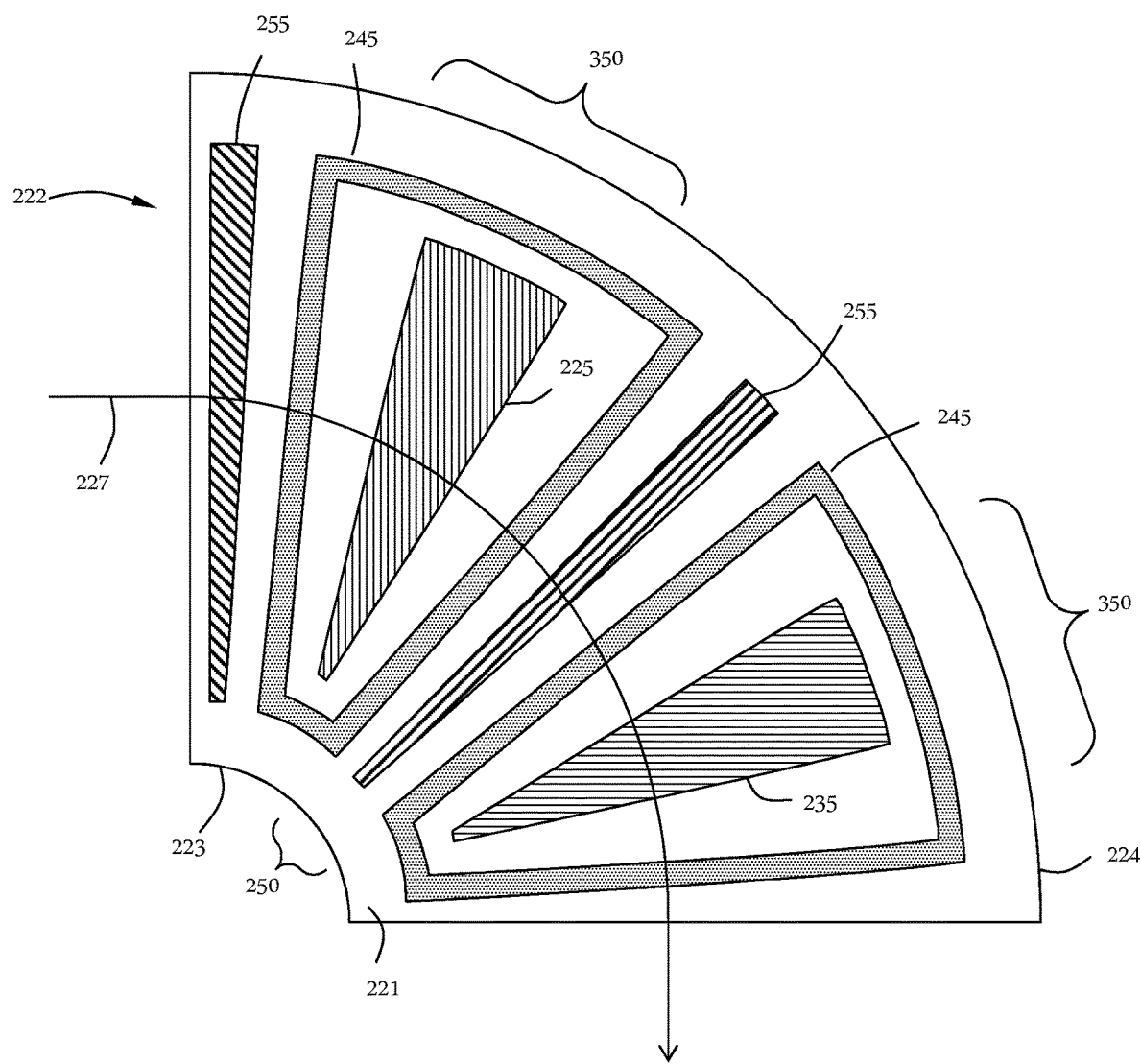
FIG. 5 illustrates a schematic view of a portion of a wedge shaped gas distribution assembly for use in a batch processing chamber in accordance with one or more embodiments of the disclosure.
Figure 6:
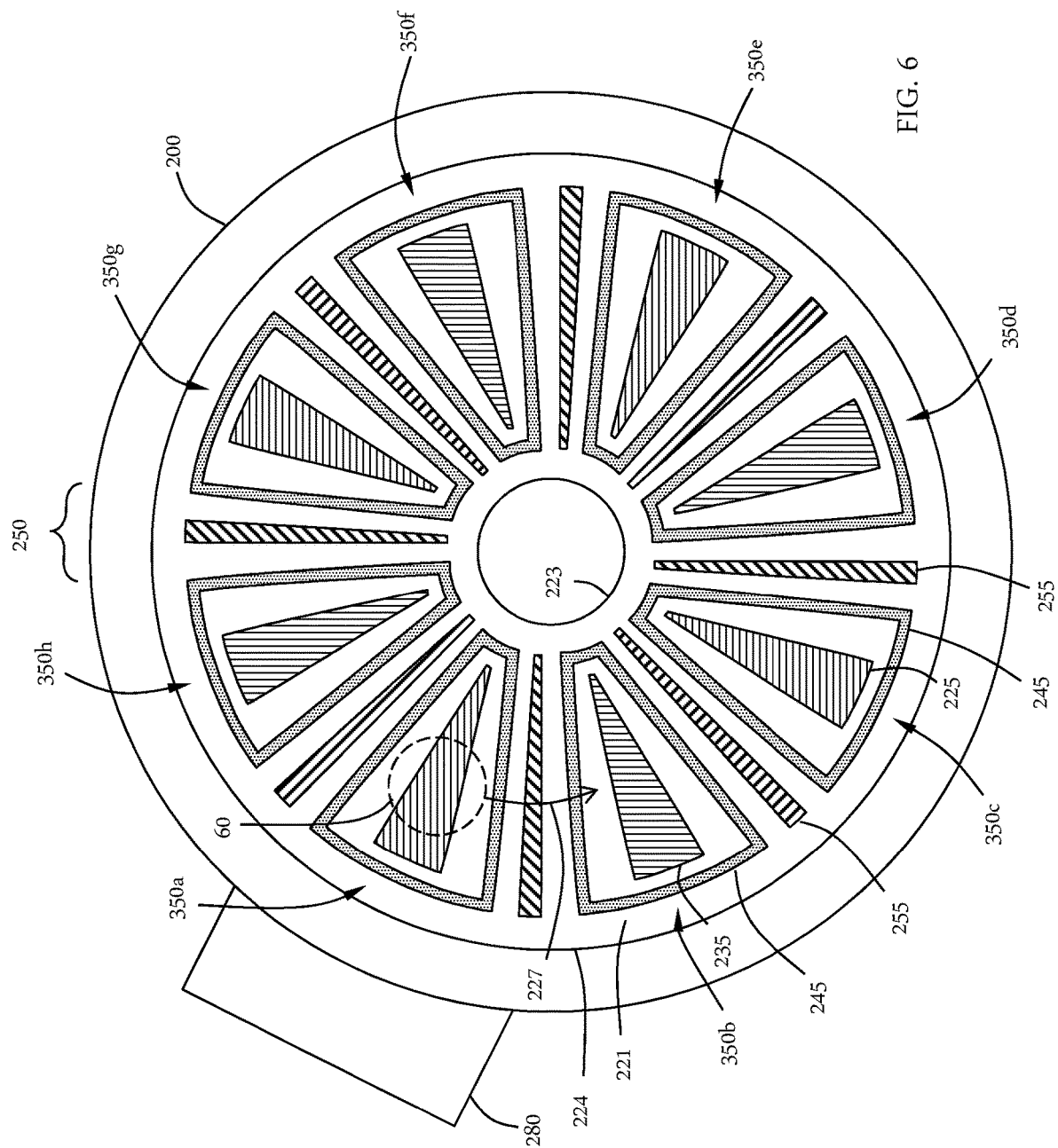
FIG. 6 illustrates a schematic view of a batch processing chamber in accordance with one or more embodiments of the disclosure.

FIG. 5 shows a sector or portion of a gas distribution assembly 220, which may be referred to as an injector unit. The injector units 222 can be used individually or in combination with other injector units. For example, as shown in FIG. 6, four of the injector units 222 of FIG. 5 are combined to form a single gas distribution assembly 220. (The lines separating the four injector units are not shown for clarity.) While the injector unit 222 of FIG. 5 has both a first reactive gas port 225 and a second gas port 235 in addition to purge gas ports 255 and vacuum ports 245, an injector unit 222 does not need all of these components.

Referring to both FIGS. 5 and 6, a gas distribution assembly 220 in accordance with one or more embodiments may comprise a plurality of sectors (or injector units 222) with each sector being identical or different. The gas distribution assembly 220 is positioned within the processing chamber and comprises a plurality of elongate gas ports 225, 235, 245 in a front surface 221 of the gas distribution assembly 220. The plurality of elongate gas ports 225, 235, 245, 255 extend from an area adjacent the inner peripheral edge 223 toward an area adjacent the outer peripheral edge 224 of the gas distribution assembly 220. The plurality of gas ports shown include a first reactive gas port 225, a second gas port 235, a vacuum port 245 which surrounds each of the first reactive gas ports and the second reactive gas ports and a purge gas port 255.

With reference to the embodiments shown in FIG. 5 or 6, when stating that the ports extend from at least about an inner peripheral region to at least about an outer peripheral region, however, the ports can extend more than just radially from inner to outer regions. The ports can extend tangentially as vacuum port 245 surrounds reactive gas port 225 and reactive gas port 235. In the embodiments shown in FIGS. 5 and 6, the wedge shaped reactive gas ports 225, 235 are surrounded on all edges, including adjacent the inner peripheral region and outer peripheral region, by a vacuum port 245.

Referring to FIG. 5, as a substrate moves along path 227, each portion of the substrate surface is exposed to the various reactive gases. To follow the path 227, the substrate will be exposed to, or "see", a purge gas port 255, a vacuum port 245, a first reactive gas port 225, a vacuum port 245, a purge gas port 255, a vacuum port 245, a second gas port 235 and a vacuum port 245. Thus, at the end of the path 227 shown in FIG. 5, the substrate has been exposed to the first reactive gas and the second reactive gas to form a layer. The injector unit 222 shown makes a quarter circle but could be larger or smaller. The gas distribution assembly 220 shown in FIG. 6 can be considered a combination of four of the injector units 222 of FIG. 3 connected in series.

The injector unit 222 of FIG. 5 shows a gas curtain 250 that separates the reactive gases. The term "gas curtain" is used to describe any combination of gas flows or vacuum that separate reactive gases from mixing. The gas curtain 250 shown in FIG. 5 comprises the portion of the vacuum port 245 next to the first reactive gas port 225, the purge gas port 255 in the middle and a portion of the vacuum port 245 next to the second gas port 235. This combination of gas flow and vacuum can be used to prevent or minimize gas phase reactions of the first reactive gas and the second reactive gas.

Referring to FIG. 6, the combination of gas flows and vacuum from the gas distribution assembly 220 form a separation into a plurality of process regions 350. The process regions are roughly defined around the individual gas ports 225, 235 with the gas curtain 250 between 350. The embodiments shown in FIG. 6 makes up eight separate process regions 350 with eight separate gas curtains 250 between. A processing chamber can have at least two process regions. In One or more embodiments, there are at least three, four, five, six, seven, eight, nine, 10, 11 or 12 process regions.

During processing a substrate may be exposed to more than one process region 350 at any given time. However, the portions that are exposed to the different process regions will have a gas curtain separating the two. For example, if the leading edge of a substrate enters a process region including the second gas port 235, a middle portion of the substrate will be under a gas curtain 250 and the trailing edge of the substrate will be in a process region including the first reactive gas port 225.

A factory interface (as shown in FIG. 4), which can be, for example, a load lock chamber 280, is shown connected to the processing chamber 200. A substrate 60 is shown superimposed over the gas distribution assembly 220 to provide a frame of reference. The substrate 60 may often sit on a susceptor assembly to be held near the front surface 221 of the gas distribution assembly 220. The substrate 60 is loaded via the factory interface into the processing chamber 200 onto a substrate support or susceptor assembly (see FIG. 4). The substrate 60 can be shown positioned within a process region because the substrate is located adjacent the first reactive gas port 225 and between two gas curtains 250a, 250b. Rotating the substrate 60 along path 227 will move the substrate counter-clockwise around the processing chamber 200. Thus, the substrate 60 will be exposed to the first process region 350a through the eighth process region 350h, including all process regions between.

One or more embodiments of the disclosure are directed to a processing chamber 200 with a plurality of process regions 350a-350h with each process region separated from an adjacent region by a gas curtain 250. For example, the processing chamber shown in FIG. 6. The number of gas curtains and process regions within the processing chamber can be any suitable number depending on the arrangement of gas flows. The embodiment shown in FIG. 6 has eight gas curtains 250 and eight process regions 350a-350h.

Referring back to FIG. 1, the processing platform 100 includes a treatment chamber 140 connected to a second side 112 of the central transfer station 110. The treatment chamber 140 of one or more embodiments is configured to expose the wafers to a process to treat the wafers before and/or after processing in first batch processing chamber 120. The treatment chamber 140 of one or more embodiments comprises an annealing chamber. The annealing chamber can be a furnace annealing chamber or a rapid thermal annealing chamber, or a different chamber configured to hold a wafer at a predetermined temperature and pressure and provide a flow of gas to the chamber.

In one or more embodiments, the processing platform further comprises a second batch processing chamber 130 connected to a third side 113 of the central transfer station 110. The second batch processing chamber 130 can be configured similarly to the first batch processing chamber 120, or can be configured to perform a different process or to process different numbers of substrates.

The second batch processing chamber 130 can be the same as the first batch processing chamber 120 or different. In one or more embodiments, the first batch processing chamber 120 and the second batch processing chamber 130 are configured to perform the same process with the same number of wafers in the same batch time so that x (the number of wafers in the first batch processing chamber 120) and y (the number of wafers in the second batch processing chamber 130) are the same and the first batch time and second batch time (of the second batch processing chamber 130) are the same. In one or more embodiments, the first batch processing chamber 120 and the second batch processing chamber 130 are configured to have one or more of different numbers of wafers (x not equal to y), different batch times, or both.

In the embodiments shown in FIG. 1, the processing platform 100 includes a second treatment chamber 150 connected to a fourth side 114 of the central transfer station 110. The second treatment chamber 150 can be the same as the treatment chamber 140 or different.

The processing platform 100 can include a controller 195 connected to the robot 117 (the connection is not shown).

The controller 195 can be configured to move wafers between the treatment chamber 140 and the first batch processing chamber 120 with a first arm 118 of the robot 117. In one or more embodiments, the controller 195 is also configured to move wafers between the second treatment chamber 150 and the second batch processing chamber 130 with a second arm 119 of the robot 117.

In one or more embodiments, the controller 195 is connected to the susceptor assembly 240 and the gas distribution assembly 220 of a processing chamber 200. The controller 195 can be configured to rotate 17 the susceptor assembly 240 about a central axis. The controller can also be configured to control the gas flows in the gas ports 225, 235, 245, 255. In one or more embodiments, the first reactive gas port 225 provides a flow of a first reactive gas. In one or more embodiments, the second reactive gas port 235 provides a flow of a second reactive gas. In one or more embodiments, other gas ports (not labelled) may provide a flow of a plasma. The first reactive gas port 225, the second reactive gas port 235 and the other reactive gas ports (not labelled) may be arranged in any processing order.

The processing platform 100 can also include a first buffer station 151 connected to a fifth side 115 of the central transfer station 110 and/or a second buffer station 152 connected to a sixth side 116 of the central transfer station 110. The first buffer station 151 and second buffer station 152 can perform the same or different functions. For example, the buffer stations may hold a cassette of wafers which are processed and returned to the original cassette, or the first buffer station 151 may hold unprocessed wafers which are moved to the second buffer station 152 after processing. In one or more embodiments, one or more of the buffer stations are configured to pre-treat, pre-heat or clean the wafers before and/or after processing.

In one or more embodiments, the controller 195 is configured to move wafers between the first buffer station 151 and one or more of the treatment chamber 140 and the first batch processing chamber 120 using the first arm 118 of the robot 117. In one or more embodiments, the controller 195 is configured to move wafers between the second buffer station 152 and one or more of the second treatment chamber 150 or the second batch processing chamber 130 using the second arm 119 of the robot 117.

The processing platform 100 may also include one or more slit valves 160 between the central transfer station 110 and any of the processing chambers. In the embodiments shown, there is a slit valve 160 between each of the processing chambers 120, 130, 140, 150 and the central transfer station 110. The slit valves 160 can open and close to isolate the environment within the processing chamber from the environment within the central transfer station 110. For example, if the processing chamber will generate plasma during processing, it may be helpful to close the slit valve for that processing chamber to prevent stray plasma from damaging the robot in the transfer station.

In one or more embodiments, the processing chambers are not readily removable from the central transfer station 110. To allow maintenance to be performed on any of the processing chambers, each of the processing chambers may further include a plurality of access doors 170 on sides of the processing chambers. The access doors 170 allow manual access to the processing chamber without removing the processing chamber from the central transfer station 110. In the embodiments shown, each side of each of the processing chamber, except the side connected to the transfer station, have an access door 170. The inclusion of so many access doors 170 can complicate the construction of the processing chambers employed because the hardware within the chambers would need to be configured to be accessible through the doors.

The processing platform of one or more embodiments includes a water box 180 connected to the central transfer station 110. The water box 180 can be configured to provide a coolant to any or all of the processing chambers. Although referred to as a "water" box, those skilled in the art will understand that any coolant can be used.

In one or more embodiments, the size of the processing platform 100 allows for the connection to house power through a single power connector 190. The single power connector 190 attaches to the processing platform 100 to provide power to each of the processing chambers and the central transfer station 110.

In one or more embodiments, the processing platform 100 can be connected to a factory interface 102 to allow wafers or cassettes of wafers to be loaded into the processing platform 100. A robot 103 within the factory interface 102 can be moved the wafers or cassettes into and out of the buffer stations 151, 152. The wafers or cassettes can be moved within the processing platform 100 by the robot 117 in the central transfer station 110. In one or more embodiments, the factory interface 102 is a transfer station of another cluster tool.

In one or more embodiments, the processing platform 100 or first batch processing chamber 120 is connected to a controller. The controller can be the same controller 195 or a different controller. The controller can be coupled to the susceptor assembly and the gas distribution assembly of the first batch processing chamber 120 and has one or more configurations. The configurations can include, but are not limited to, a first configuration to rotate the susceptor assembly about the central axis, a second configuration to provide a flow of a first reactive gas to a process region, a third configuration to provide a flow of a second reactive gas to a process region, a fourth configuration to provide a plasma in a process region.

In some embodiments, there are more than one controller connected to the individual components and a primary control processor is coupled to each separate controller or processor to control the processing platform 100 or the first batch processing chamber 120.

The controller may be one of any form of general-purpose computer processor, microcontroller, microprocessor, etc., that can be used in an industrial setting for controlling various elements and/or sub-processors.

The at least one controller can have a processor, a memory coupled to the processor, input/output devices coupled to the processor, and support circuits to communicate between the different electronic components. The memory can include one or more of transitory memory (e.g., random access memory) and non-transitory memory (e.g., storage).

The memory, or computer-readable medium, of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the electrostatic chuck. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the processing platform to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the electrostatic chuck operation such that the disclosed processes are performed.

In some embodiments, the controller has one or more configurations to execute individual processes or sub-processes to perform the disclosed methods. The controller can be connected to and configured to operate intermediate components to perform the functions of the methods. For example, the controller can be connected to and configured to control one or more of gas valves, actuators, motors, power sources, heaters, plasma components, vacuum control, etc.

The controller or non-transitory computer readable medium of some embodiments has one or more configurations selected from: a configuration to rotate the susceptor assembly about the central axis, a configuration to provide a flow of a first reactive gas to a process region, a configuration to provide a flow of a second reactive gas to a process region, a configuration to provide a plasma in a process region, a configuration to provide a purge gas and/or vacuum stream to a gas curtain, and/or a configuration to measure film thickness.

Figure 7:
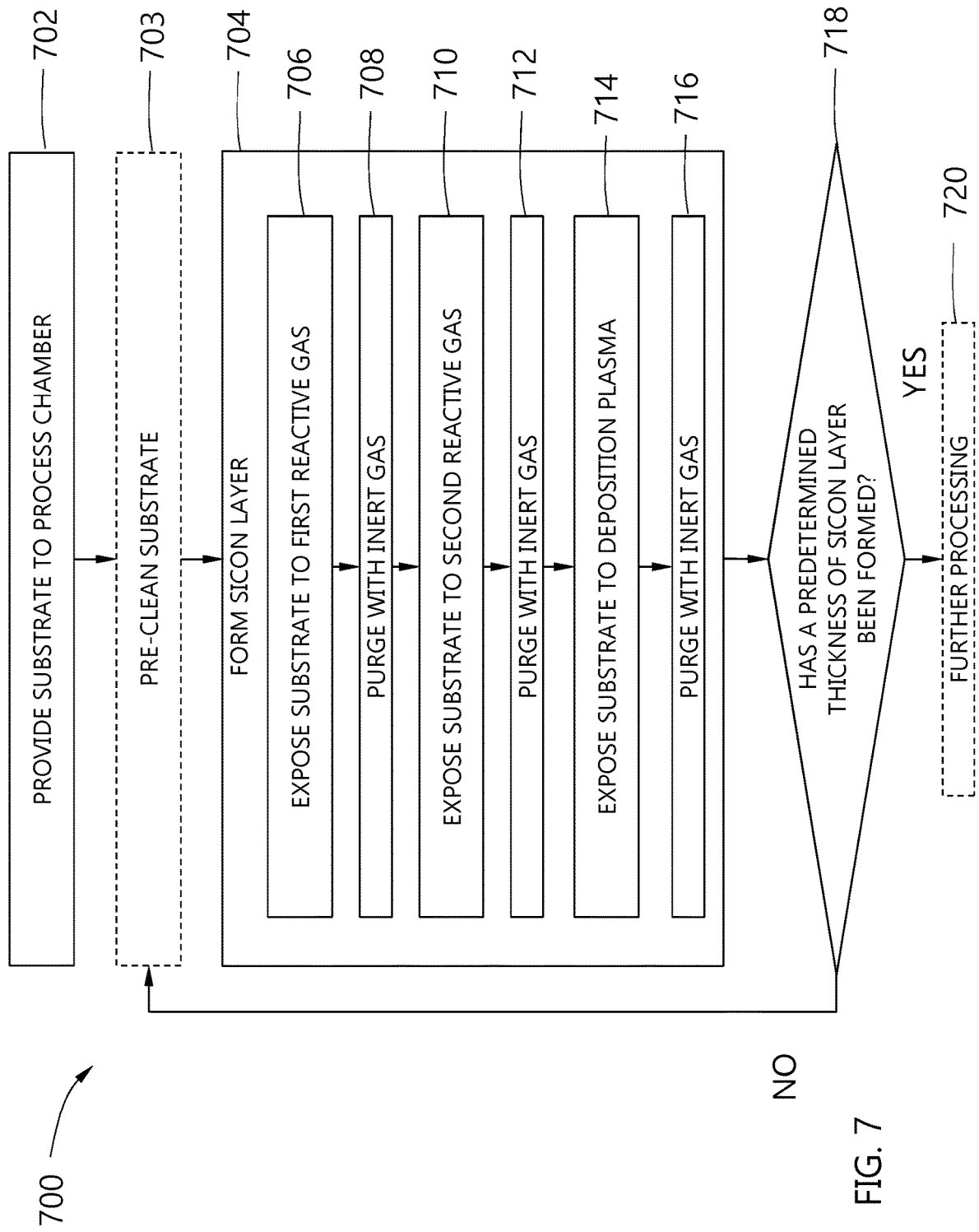
FIG. 7 illustrates a process flow diagram of a process sequence for the formation of a SiCON layer using a PEALD method according to one or more embodiments of the disclosure.

FIG. 7 illustrates a process flow diagram depicting a generalized method for forming a SiCON film on a substrate in accordance with one or more embodiments of the disclosure. As used in this specification and the appended claims, a SiCON film comprises silicon, carbon, oxygen and nitrogen atoms. The SiCON film may also be referred to as silicon oxycarbonitride or carbon doped silicon oxynitiride.

The method 700 generally begins at operation 702, where a substrate upon which a SiCON film is to be formed is provided to (e.g. placed into or positioned within) a processing chamber. In some embodiments, the operation of providing the substrate may be excluded as the substrate may already be present in the processing chamber as a result of a previous process.

The substrate has a surface comprising a first material surface and a second material surface. For the avoidance of doubt, the first material surface is the surface of a first material. Unless stated otherwise, a description of the composition of the first material surface should be understood as describing the composition of the first material.

In some embodiments, the first material surface comprises one or more of a silicon surface, an amine-terminated surface or a metal surface. In some embodiments, the second material surface comprises silicon oxide. As used in this regard, "silicon oxide" refers to any material consisting essentially of silicon and oxygen. While silicon oxide is commonly designated as $SiO_2$, no stoichiometric ratio should be assumed for the purposes of this disclosure.

In some embodiments, the first material surface consists essentially of silicon and the second material surface comprises silicon oxide. As used in this regard, a first material surface which "consists essentially of silicon" refers to the surface of a material comprising greater than or equal to 98%, greater than or equal to 99% or greater than or equal to 99.5% silicon on an atomic basis, excluding hydrogen. In some embodiments, the first material surface comprises silicon nitride and the second material surface comprises silicon oxide.

As used herein, a "substrate surface" refers to any substrate surface upon which a layer may be formed. The substrate surface may have one or more features formed therein, one or more layers formed thereon, and combinations thereof. For the avoidance of doubt, any process disclosed herein which acts upon "the substrate" should be understood to be acting upon the substrate surface or a film already formed on the substrate surface.

In one or more embodiments, at operation 703, the substrate (or substrate surface) may be pretreated prior to the deposition of the SiCON film, for example, by polishing, cleaning, etching, reduction, oxidation, halogenation, hydroxylation, annealing, baking, preheating, or the like. In some embodiments, the substrate is pre-cleaned before the SiCON film deposition process begins at operation 704. In some embodiments, the pre-clean process at operation 703 increases the selectivity of the subsequent deposition process. In some embodiments, the pre-clean process at operation 703 increases the uniformity of the deposited film.

In some embodiments, the pre-clean process comprises exposing the substrate (or substrate surface) to a cleaning plasma. In some embodiments, the cleaning plasma comprises ions and/or radicals of nitrogen. In some embodiments, the cleaning plasma is formed from nitrogen gas ($N_2$). In some embodiments, the cleaning plasma comprises ammonia and an $NF_3$ plasma.

At operation 704, a SiCON film is selectively deposited on the substrate. In one or more embodiments, the SiCON film may be formed via a cyclical deposition process, such as atomic layer deposition (ALD), or the like. In some embodiments, the cyclic deposition process includes plasma, such as plasma enhanced ALD. In one or more embodiments, the selective deposition of the SiCON film via a cyclical deposition process may generally comprise exposing the substrate to two or more process gases separately.

In time-domain ALD embodiments, exposure to each of the process gases are separated by a time delay/pause to allow the components of the process gases to adhere and/or react on the substrate surface. Alternatively, or in combination, in one or more embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In one or more embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any embodiments of a time-domain ALD or spatial ALD process, the sequence may be repeated until a predetermined layer thickness is formed on the substrate surface.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

In one or more embodiments, the process of forming the SiCON film at operation 704 may begin by exposing the substrate to a first reactive gas at operation 706. In one or more embodiments, the first reactive gas comprises a halosilane. In some embodiments, the first reactive gas comprises a halosilane with the general formula $Si_aH_bX_c$, where X is a halogen, a is 1 to 4, b is 0 to 2x+1 and c is 1 to 2x+2. In some embodiments, the halogen is not fluorine. In some embodiments, the first reactive gas comprises or consists essentially of dichlorosilane (DCS, $Si_2H_4Cl_2$). As used in this regard a reactive gas "consists essentially of" a stated species if the reactive species in the reactive gas comprises greater than or equal to about 95%, 98%, 99% or 99.5% of the stated species on a molar basis, excluding any inert carrier or diluent gases.

In one or more embodiments, an inert gas may additionally be provided to the process chamber at the same time as the first reactive gas. The inert gas may be mixed with the first reactive gas (e.g., as a diluent gas) or be provided separately and can be pulsed or of a constant flow. In one or more embodiments, the inert gas is flowed into the processing chamber at a constant flow in the range of about 1 to about 10000 sccm. The inert gas may be any inert gas, for example, such as nitrogen ($N_2$), argon (Ar), helium (He), neon (Ne), or combinations thereof.

The temperature of the substrate the formation of the SiCON film can be controlled, for example, by setting the temperature of the substrate support or susceptor. In one or more embodiments, the substrate is maintained at a temperature in the range of about 200° C. to about 600° C., or in the range of about 300° C. to about 600° C., or in the range of about 400° C. to about 600° C., or in the range of about 450° C. to about 550° C.

In one or more embodiments, the substrate is maintained at a temperature less than or equal to about 400° C., or less than or equal to about 350° C., or less than about 300° C. In one or more embodiments, the substrate is maintained at a temperature greater than or equal to about 250° C., or greater than or equal to about 300° C., or greater than about 350° C. In one or more embodiments, the substrate is maintained at a temperature of about 280° C.

The first reactive gas may be provided in one or more pulses or continuously. The flow rate of the first reactive gas can be any suitable flow rate including, but not limited to, flow rates in the range of about 10 to about 5000 sccm, or in the range of about 50 to about 4000 sccm, or in the range of about 100 to about 3000 sccm, or in the range of about 250 to about 2000 sccm, or in the range of about 500 to about 1500 sccm, or in the range of about 600 to about 1400 sccm.

In one or more embodiments, the period of time that the substrate is exposed to the first reactive gas may be any suitable amount of time necessary to allow the halosilane to react with the substrate surface. For example, the first reactive gas may be flowed into the process chamber for a period of about 0.1 seconds to about 90 seconds. In some time-domain ALD processes, the first reactive gas is exposed the substrate surface for a time in the range of about 0.1 sec to about 90 sec, or in the range of about 0.1 sec to about 60 sec, or in the range of about 0.1 sec to about 30 sec, or in the range of about 0.1 sec to about 15 sec, or in the range of about 0.1 sec to about 10 sec, or in the range of about 0.1 sec to about 5 sec, or in the range of about 0.2 sec to about 1.5 sec.

In addition to the foregoing, additional process parameters may be regulated while exposing the substrate to the first reactive gas. For example, in one or more embodiments, the process chamber may be maintained at a pressure of about 4 to about 30 Torr, or in the range of about 5 to about 20 Torr, or in the range of about 6 to about 10 Torr. In some embodiments, the process chamber is maintained at a pressure of about 6.5 Torr.

Next, at operation 708, the first reactive gas may be purged from the substrate surface using an inert gas, also referred to as a purge gas. The purge gas may be any inert gas, for example, such as nitrogen, argon, helium, neon, or the like. In one or more embodiments, the inert gas may be the same, or alternatively, may be different from the inert gas provided to the process chamber during the exposure of the substrate to the first reactive gas at operation 706. In some embodiments, the purge gas comprises $N_2$.

In embodiments where the inert gas is the same, the purge may be performed by diverting the first process gas from the process chamber, allowing the inert gas to flow through the process chamber, purging the process chamber of any excess first reactive gas components or reaction byproducts. In one or more embodiments, the inert gas may be provided at the same flow rate used in conjunction with the first process gas, described above, or in one or more embodiments, the flow rate may be increased or decreased. For example, in one or more embodiments, the inert gas may be provided to the process chamber at a flow rate of about 0 to about 10000 sccm to purge the process chamber. In spatial ALD, purge gas curtains are maintained between the flows of reactive gases. In one or more embodiments of a spatial ALD process, the process chamber or region of the process chamber may be purged with a purge gas. The flow of purge gas may facilitate removing any excess first reactive gas components and/or excess reaction byproducts from the process chamber to prevent unwanted gas phase reactions of the first and second reactive gases.

Next, at operation 710, the substrate is exposed to a second reactive gas for a second period of time. The second reactive gas reacts with the adsorbed layer of first reactive gas on the substrate surface to deposit a SiCON film. In some embodiments, the second reactive gas comprises or consists essentially of an alkanolamine. In some embodiments, the second reactive gas comprises an alkanolamine and an amine.

Suitable alkanolamines comprise a hydroxyl group and an amine group joined by an alkyl group. In some embodiments, the alkyl group comprises a number of carbon atoms in a range of 1 to 6. In some embodiments, the alkanolamine comprises more than one hydroxyl group. In some embodiments, the alkanolamine comprises more than one amine group. In some embodiments, the alkanolamine comprises or consists essentially of ethanolamine.

Suitable amines include, but are not limited to, primary amines, secondary amines and tertiary amines. In some embodiments, the amine comprises more than one amino group. In some embodiments, the amine comprises or consists essentially of ethylenediamine.

In some embodiments, the ratio of alkanolamine:amine in the second reactive gas may be controlled. In some embodiments, the second reactive gas comprises a ratio of alkanolamine:amine in a range of about 10:1 to about 1:10, about 10:1 to about 1:1, about 5:1 to about 2:1 or about 3:1 to about 2:1. In some embodiments, the second reactive gas comprises a ratio of ethanolamine:ethylenediamine in a range of about 10:1 to about 1:1, about 5:1 to about 2:1 or about 3:1 to about 2:1. In some embodiments, the ratio of ethanolamine:ethylenediamine is about 7:3.

Without being bound by theory, the ratio of alkanolamine:amine in the second reactive gas is believed to control the elemental composition of the deposited SiCON film. In this regard, the alkanolamine is believed to function as a source of carbon, oxygen and nitrogen, while the amine is believed to function as a source of carbon and nitrogen.

In some embodiments, the ratio of alkanolamine:amine is controlled to deposit a SiCON film with a specific film composition. In some embodiments, the SiCON film has a carbon content in a range of about 2 to about 5 atomic percent, or about 3.5 to about 5 atomic precent. In some embodiments, the SiCON film has a nitrogen content in a range of about 25 to about 35 percent, or about 30 to about 35 atomic percent. In some embodiments, the SiCON film has an oxygen content in a range of about 20 to about 25 atomic percent, or about 21 to about 24 atomic percent. In some embodiments, the SiCON film has a silicon content in a range of about 40 to about 45 percent. In some embodiments, the SiCON film has a chlorine content of less than or equal to about 2 atomic percent or less than or equal to about 1 atomic percent.

The composition of the deposited SiCON film can be determinative of certain film properties. For example, in some embodiments, the ratio of alkanolamine:amine is controlled to provide a SiCON film with a predetermined k-value. In some embodiments, the SiCON film has a k-value in a range of about 4 to about 5. Also, in some embodiments, the ratio of alkanolamine:amine is controlled to provide a SiCON film with a relatively low wet etch rate. Without being bound by theory, it is believed that the carbon content of the SiCON film decreases the wet etch rate. In some embodiments, the wet etch rate of the SiCON film decreases over time. In some embodiments, the SiCON film has a wet etch rate in dilute hydrofluoric acid (about 100:1 water:HF; "DHF") during the first minute of exposure of less than or equal to about 5 Å/min. In some embodiments, the SiCON film has a wet etch rate in 100:1 DHF during the first minute of exposure of less than or equal to about 2 Å/min.

In one or more embodiments, an inert gas may additionally be provided to the process chamber at the same time as the second reactive gas. The inert gas may be mixed with the first reactive gas (e.g., as a diluent gas) or be provided separately and can be pulsed or of a constant flow. In one or more embodiments, the inert gas is flowed into the processing chamber at a constant flow in the range of about 1 to about 10000 sccm. The inert gas may be any inert gas, for example, such as nitrogen ($N_2$), argon (Ar), helium (He), neon (Ne), or combinations thereof.

As above at operation 706, at operation 710, the process parameters may be regulated while exposing the substrate to the second reactive gas. The regulated parameters may include, but are not limited to, substrate temperature, second reactive gas flow rate, second reactive gas pressure and chamber pressure. In some embodiments, the process parameters during exposure to the second reactive gas are the same as the process parameters during exposure to the first reactive gas. In some embodiments, the process parameters during exposure to the second reactive gas may be different from the parameters during exposure to the first reactive gas. In these embodiments, the process parameters during exposure to the second reactive gas are selected from the parameters outlined above with respect to operation 706.

Next, at operation 712, the process chamber may be purged using an inert gas. Operation 712 is similar to operation 708 described above. In some embodiments, the process parameters while purging the substrate surface at operation 712 are the same as the process parameters while purging the substrate surface at operation 708. In some embodiments, the process parameters while purging the substrate surface at operation 712 may be different from the parameters while purging the substrate surface at operation 708. In these embodiments, the process parameters while purging the substrate surface at operation 712 are selected from the parameters outlined above with respect to operation 708.

Next, at operation 714, the substrate surface is exposed to a deposition plasma. In some embodiments, the plasma exposure at 714 is separated from other processes by purging with a purge gas at 712 and 716. In some embodiments, the deposition plasma is generated from a deposition plasma gas comprising hydrogen gas ($H_2$). In some embodiments, the deposition plasma gas comprises substantially no nitrogen. As used in this regard, "substantially no nitrogen" means that the deposition plasma gas comprises less than or equal to about 2%, less than or equal to about 1%, less than or equal to about 0.5%, or less than or equal to about 0.1% of nitrogen on an atomic basis. In some embodiments, the deposition plasma gas further comprises an inert gas selected from argon, helium, krypton or xenon. In some embodiments, the inert gas consists of argon. In some embodiments, the ratio of hydrogen to the inert gas can be controlled. In some embodiments, the ratio of hydrogen:inert gas is in a range of about 1:100 to about 100:1. In some embodiments, the ratio of hydrogen:inert gas is less than or equal to about 1:1, less than or equal to about 1:2, less than or equal to about 1:5, or less than or equal to about 1:9.

In some embodiments, the deposition plasma is generated remotely. In some embodiments, the deposition plasma is a conductively coupled plasma (CCP). In some embodiments, the CCP plasma source has a frequency of about 60 MHz. Any suitable power can be used depending on, for example, the reactants, the composition of the first material and second material, or the other process conditions. In some embodiments, the deposition plasma is generated with a plasma power in the range of about 5 W to about 50 W. In some embodiments, the deposition plasma is generated with a plasma power less than or equal to about 50 W, less than or equal to about 50 W, less than or equal to about 25 W, less than or equal to about 20 W, less than or equal to about 15 W, or less than or equal to about 10 W.

Next, at operation 716, the process chamber may be purged using an inert gas. Operation 716 is similar to operation 708 and operation 712 described above. In some embodiments, the process parameters while purging the substrate surface at operation 716 are the same as the process parameters while purging the substrate surface at operation 708 or operation 712. In some embodiments, the process parameters while purging the substrate surface at operation 716 may be different from the parameters while purging the substrate surface at operation 708 and operation 712. In these embodiments, the process parameters while purging the substrate surface at operation 716 are selected from the parameters outlined above with respect to operation 708 and operation 712.

In one or more embodiments, at decision point 718, it is determined whether the SiCON film has achieved a predetermined thickness. If the predetermined thickness has not been achieved, the method 700 returns to optional operation 703 to continue forming the SiCON film until the predetermined thickness is reached. Once the predetermined thickness has been reached, the method 700 can either end or proceed to operation 720 for further processing (e.g., bulk deposition of a metal film).

Reference throughout this specification to "one embodiment," "certain embodiments," "one or more embodiments", "an embodiment" or "some embodiments" means that a particular feature, structure, material, or characteristic described in connection with the embodiment is included in at least one embodiment of the disclosure. Thus, the appearances of the phrases such as "in one or more embodiments," "in certain embodiments," "in one embodiment", "in an embodiment" or "in some embodiments" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of selectively depositing a SiCON film, the method comprising:
   exposing a substrate comprising a first material surface and a silicon oxide surface in a processing region to a first reactive gas comprising a halosilane to form an adsorbed layer of the first reactive gas on the first material surface,
   purging the first reactive gas from the substrate;
   exposing the absorbed layer of first reactive gas to a second reactive gas comprising an alkanolamine and an amine to form a SiCON film on the first material surface;
   purging the second reactive gas from the substrate;
   exposing the SiCON film to a deposition plasma comprising $H_2$ purging the deposition plasma; and
   repeating the method to form a SiCON layer with a first thickness on the first material surface in a range of about 30 Å to about 50 Å without substantial deposition on the silicon oxide surface.

2. The method of claim 1, wherein the first material surface is a silicon surface.

3. The method of claim 1, wherein the first material surface is a silicon nitride surface.

4. The method of claim 1, further comprising pre-cleaning the first material surface and the silicon oxide surface before exposure to the first reactive gas.

5. The method of claim 4, wherein pre-cleaning the first material surface and the silicon oxide surface comprises exposure to a cleaning plasma formed from $N_2$.

6. The method of claim 1, wherein the first reactive gas consists essentially of dichlorosilane.

7. The method of claim 1, wherein each sequential exposure is separated by a purge gas comprising $N_2$.

8. The method of claim 1, wherein the alkanolamine comprises ethanolamine.

9. The method of claim 1, wherein the amine comprises ethylenediamine.

10. The method of claim 1, wherein the second reactive gas comprises a ratio of alkanolamine:amine in a range of about 10:1 to about 1:10.

11. The method of claim 10, wherein the second reactive gas comprises a ratio of ethanolamine:ethylenediamine in a range of about 10:1 to about 1:1.

12. The method of claim 11, wherein the ratio of ethanolamine:ethylenediamine is about 7:3.

13. The method of claim 12, wherein the SiCON film has a k-value in a range of about 4 to about 5.

14. The method of claim 12, wherein the SiCON film has a wet etch rate in 100:1 DHF during the first minute of exposure of less than or equal to about 5 Å/min.

15. The method of claim 1, wherein the deposition plasma has a power less than or equal to 20 W.

16. A method of selectively depositing a SiCON layer, the method comprising:
   sequentially exposing a first material surface and a silicon oxide surface to a first reactive gas, a second reactive gas and a deposition plasma, the first reactive gas comprising a halosilane, the second reactive gas comprising ehtylenediamine and ethanolamine, and the deposition plasma comprising $H_2$; and
   repeating the sequential exposures to form a SiCON layer with a first thickness on the first material surface in a range of about 30 Å to about 50 Å without substantial deposition on the silicon oxide surface.

17. The method of claim 16, further comprising pre-cleaning the first material surface and the silicon oxide surface before exposure to the first reactive gas.

18. A method of selectively depositing a SiCON layer, the method comprising:
   positioning a substrate with a first material surface and a silicon oxide surface within a processing chamber comprising a plurality of processing regions;
   forming an adsorbed layer of halosilane on the first material surface by exposing the first material surface and the silicon oxide surface to a first process condition in a first process region, the first process condition comprising a halosilane;
   laterally moving the substrate through a gas curtain from the first process region to a second process region, the gas curtain comprising a purge gas stream and optionally a vacuum region;

forming a SiCON film by exposing the adsorbed layer of halosilane to a second process condition in the second process region, the second process condition comprising an alkanolamine and an amine;

laterally moving the substrate through a gas curtain from the second process region to a third process region, the gas curtain comprising a purge gas stream and optionally a vacuum region;

exposing the SiCON film to a third process condition in the third process region, the third process condition comprising a deposition plasma comprising $H_2$ with a power less than or equal to 20 W;

laterally moving the substrate through a gas curtain from the third process region, the gas curtain comprising one or more of a purge gas stream and/or a vacuum region; and repeating exposures to the first process condition, the second process condition and the third process condition to selectively deposit a SiCON film with a first thickness on the first material surface in a range of about 30 Å to about 50 Å without substantial deposition on the silicon oxide surface.

\* \* \* \* \*